United States Patent
Yokokawa et al.

(10) Patent No.: US 8,361,888 B2
(45) Date of Patent: Jan. 29, 2013

(54) METHOD FOR MANUFACTURING SOI WAFER

(75) Inventors: Isao Yokokawa, Annaka (JP); Nobuhiko Noto, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 455 days.

(21) Appl. No.: 12/451,533

(22) PCT Filed: May 27, 2008

(86) PCT No.: PCT/JP2008/001312
§ 371 (c)(1),
(2), (4) Date: Nov. 17, 2009

(87) PCT Pub. No.: WO2008/155876
PCT Pub. Date: Dec. 24, 2008

(65) Prior Publication Data
US 2010/0129993 A1 May 27, 2010

(30) Foreign Application Priority Data
Jun. 21, 2007 (JP) .................. 2007-164238

(51) Int. Cl.
*H01L 21/762* (2006.01)
(52) U.S. Cl. ........ 438/479; 438/480; 438/458; 438/459; 257/627; 257/E21.214; 257/E21.561
(58) Field of Classification Search .................. 438/479, 438/149, 300, 480, 458, 459; 257/627, E21.214, 257/E21.561
See application file for complete search history.

(56) References Cited

U.S. PATENT DOCUMENTS

| 5,340,435 A | 8/1994 | Ito et al. |
|---|---|---|
| 6,251,754 B1 | 6/2001 | Ohshima et al. |
| 6,287,941 B1 | 9/2001 | Kang et al. |
| 6,342,433 B1 * | 1/2002 | Ohmi et al. .................. 438/455 |
| 6,417,108 B1 * | 7/2002 | Akino et al. .................. 438/690 |
| 6,600,173 B2 * | 7/2003 | Tiwari .............................. 257/74 |

(Continued)

FOREIGN PATENT DOCUMENTS

| CN | 101192510 A | 6/2008 |
|---|---|---|
| EP | 1 758 168 A1 | 2/2007 |

(Continued)

OTHER PUBLICATIONS

International Search Report issued on Sep. 2, 2008 in the corresponding International Application No. PCT/JP2008/001312.
Office Action issued in CN 2008800210341, issued Dec. 1, 2010. (with partial English-language translation).
Tanno et al., "Selective Silicon Epitaxy Using Reduced Pressure Technique," Japanese Journal of Applied Physics, Japan, vol. 21, No. 9, Sep. 1982, pp. L564-L566.

(Continued)

Primary Examiner — Thinh T Nguyen
(74) Attorney, Agent, or Firm — Oliff & Berridge, PLC

(57) ABSTRACT

The present invention provides a method for manufacturing an SOI wafer wherein an HCl gas is mixed in a reactive gas at a step of forming a silicon epitaxial layer on an entire surface of an SOI layer of the SOI wafer having an oxide film on a terrace portion. As a result, it is possible to provide the method for manufacturing an SOI wafer that can easily grow the silicon epitaxial layer on the SOI layer of the SOI wafer having the oxide film on the terrace portion, suppress warpage of the SOI wafer to be manufactured, reduce generation of particles even at subsequent steps, e.g., device manufacture, and decrease a cost for manufacturing such an SOI wafer.

6 Claims, 6 Drawing Sheets

U.S. PATENT DOCUMENTS

| | | | |
|---|---|---|---|
| 7,175,709 B2 * | 2/2007 | Tsai et al. | 117/86 |
| 2001/0046746 A1 | 11/2001 | Yokokawa et al. | |
| 2008/0124899 A1 | 5/2008 | Lin | |

FOREIGN PATENT DOCUMENTS

| | | |
|---|---|---|
| EP | 1 855 309 A1 | 11/2007 |
| JP | A-63-21822 | 1/1988 |
| JP | A-2-1116 | 1/1990 |
| JP | A-04-373121 | 12/1992 |
| JP | A-10-321548 | 12/1998 |
| JP | A-2000-30995 | 1/2000 |
| JP | A-2000-196047 | 7/2000 |
| JP | A-2004-281805 | 10/2004 |
| JP | A-2005-340622 | 12/2005 |
| JP | A-2006-270039 | 10/2006 |
| JP | A-2008-135720 | 6/2008 |
| WO | WO 2006/092886 A1 | 9/2006 |

OTHER PUBLICATIONS

Ghandhi, "VLSI Fabrication Principles: Silicon and Gallium Arsenide," Jan. 1983, pp. 243-244.

Edited by O'Mara et al., "Handbook of Semiconductor Silicon Technology," Jan. 1990, pp. 284-286.

Supplementary European Search Report issued in European Patent Application No. 08763912 on Jun. 4, 2010.

Jul. 24, 2012 Notification of Reasons for Refusal issued in Japanese Patent Application No. 2007-316013 (with partial translation).

Jun. 29, 2012 Communication issued in European Patent Application No. 08763912.6.

* cited by examiner (A)

(B)

ENLARGED VIEW OF TERRACE PORTION (A)

(B)

(C)

METHOD FOR MANUFACTURING SOI WAFER

TECHNICAL FIELD

The present invention relates to a method for manufacturing an SOI wafer, and more particularly to a method for manufacturing an SOI wafer having a process for forming a silicon epitaxial layer on an entire surface of an SOI layer in an SOI wafer having an oxide film on a terrace portion.

BACKGROUND ART

As one of semiconductor device wafers, there is an SOI (Silicon On Insulator) wafer having a silicon layer (which may be referred to as an SOI layer hereinafter) formed on a silicon oxide film as an insulator film. This SOI wafer has characteristics such as a small parasitic capacitance or a high radiation-proof capability since the SOI layer in a substrate surface layer portion that functions as a device fabrication region is electrically separated from the inside of the substrate by, e.g., a buried insulator layer (a buried oxide film layer (a BOX layer)). Therefore, effects such as a high-speed/low-power-consumption operation, prevention of a software error, and others can be expected, and this wafer appears promising as a substrate for a high-performance semiconductor device.

As a typical method for manufacturing this SOI wafer, there is a wafer bonding method. The wafer bonding method is a method of forming a thermal oxide film on, e.g., a surface of at least one of a bond wafer and a base wafer consisting of a silicon single crystal, then closely attaching the two wafers to each other through the formed thermal oxide film, performing a bonding heat treatment to increase a bonding force, and thereafter reducing a film thickness of one wafer (a wafer on which the SOI layer is formed (which will be referred to as the bond wafer hereinafter)) by, e.g., grinding or mirror polishing, thereby manufacturing an SOI wafer.

In case of the thus manufactured SOI wafer, a portion called a polishing sag or a chamfered portion where a thickness is slightly small is present in a peripheral portion of the two bonded wafers, and bonding is not effected in such a portion, or this portion remains as a unbonded portion having a weak bonding force. When a film thickness is reduced by, e.g., grinding while such an unbonded portion is present, the unbonded portion is partially delaminated during the film thickness reducing process. Therefore, the bond wafer having a reduced film thickness has a diameter smaller than that of the base wafer that serves as a base, and small irregularities are continuously formed in the peripheral portion.

When such an SOI wafer is put in a device process, the remaining unbonded portion is delaminated during the device process, particles are produced, and a device yield is lowered.

Therefore, the remaining unbonded portion is removed in advance by attaching a masking tape to expose the peripheral portion on the upper surface of the thinned bond wafer and performing etching. The outer peripheral region where the unbonded portion is removed and the base wafer is exposed in this manner is called a terrace portion.

On the other hand, as a method for reducing a film thickness of a bond wafer, there is a method of previously forming an ion implanted layer having hydrogen ions or the like implanted therein on a bond wafer before bonding, bonding the bond wafer to a base wafer, and then delaminating the bond wafer at the ion implanted layer to reduce a film thickness of the bond wafer besides the above-described method based on grinding/polishing. This so-called ion implantation delamination method can reduce a film thickness of an SOI layer to be fabricated and greatly improve film thickness uniformity, and hence this method has been actively utilized.

According to this ion implantation delamination method, likewise, a polishing sag portion becomes an unbonded portion, and an SOI layer is not transferred to the polishing sag portion after delamination, thus resulting in a terrace portion where a base wafer is exposed.

In recent years, as a wafer that is very useful for a bipolar device or a power device, an SOI wafer having a relatively large thickness in which an SOI layer has a film thickness of several µm to several-ten µm has been greatly expected.

However, when manufacturing a high-quality SOI wafer that a film thickness of an SOI layer must be several µm and a thickness tolerance must be approximately ±0.1 µm, the method for reducing a film thickness of a bond wafer by grinding/polishing can obtain radial uniformity of at most approximately ±0.3 µm only with respect to a target film thickness even though a highly accurate polishing technique is utilized, irregularities in film thickness of the SOI layer are considerable, and the film thickness uniformity has a limit.

Thus, as a method for realizing this configuration, there is, e.g., Japanese Patent Application Laid-open No. 2000-30995. In this Japanese Patent Application Laid-open No. 2000-30995, a thin SOI layer is formed by the ion implantation delamination method that can relatively easily obtain the film thickness uniformity of SOI layer that is ±0.01 µm or below, and epitaxial growth is carried out on a surface of this SOI layer, thereby increasing a film thickness of the SOI layer.

In this case, however, when an oxide film is previously formed on a base wafer and wafers are then bonded to fabricate an SOI wafer while considering warpage of the SOI wafer, since the oxide film on a peripheral terrace portion (the unbonded portion) of the SOI wafer is exposed, carrying out the epitaxial growth on an entire surface of the SOI layer in this state causes polysilicon to grow on the oxide film on the terrace portion, resulting in a factor of, e.g., particle contamination in subsequent processes.

In general, the SOI wafer is immersed in an HF aqueous solution to remove the oxide film on the terrace portion and then the epitaxial growth is carried out in order to prevent this polysilicon from growing, but a film thickness of the oxide film on a back surface is also reduced when the oxide film on the back surface that avoids warpage remains on the base wafer, and hence the warpage of the SOI wafer to be manufactured increases.

To solve such a problem, it can be considered that the oxide film on the terrace portion alone is completely removed and then the epitaxial growth is carried out, or the oxide film on the terrace portion alone is removed after the epitaxial growth to simultaneously remove the polysilicon formed on the oxide film on the terrace portion by, e.g., a method for performing HF spin cleaning like Japanese Patent Application Laid-open No. 2006-270039 in order to prevent the oxide film on the back surface that avoids the warpage of the SOI wafer from being reduced beyond necessity, but a BOX layer below the periphery of the SOI layer is considerably corroded and an unstable overhand structure is provided when the oxide film on the terrace portion is completely removed in this manner, which results in a problem of a particle generation source.

DISCLOSURE OF INVENTION

In view of the above-described problem, it is an object of the present invention to provide a method for manufacturing an SOI wafer that can readily grow a silicon epitaxial layer on an SOI layer of an SOI wafer having an oxide film on a terrace portion, suppress the warpage of the SOI wafer to be manufactured, reduce generation of particles even in subsequent processes such as device manufacture, and can decrease a cost for manufacturing an SOI wafer.

To achieve such an object, the present invention provides a method for manufacturing an SOI wafer having at least a step of forming a silicon epitaxial layer on an entire surface of an SOI layer of an SOI wafer having an oxide film on a terrace portion, wherein an HCl gas is mixed in a reactive gas when forming the silicon epitaxial layer.

As explained above, according to the method for manufacturing an SOI wafer of the present invention, when at least forming the silicon epitaxial layer on the entire surface of the SOI layer of the SOI wafer having the oxide film on the terrace portion, mixing the HCl gas in the reactive gas enables selectively growing the silicon epitaxial layer on the SOI layer alone without causing growth of polysilicon on the oxide film at the step of forming the silicon epitaxial layer even though the oxide film is present on the terrace portion of the SOI wafer. Therefore, the polysilicon is not formed on the terrace portion of the SOI wafer, and hence generation of particles due to the polysilicon can be reduced in subsequent processes.

Further, since the polysilicon is formed on the terrace portion in the conventional epitaxial growth, a subsequent step of removing the polysilicon alone is required, but mixing the HCl gas in the reactive gas at the step of forming the epitaxial layer does not cause growth of the polysilicon on the terrace portion in the present invention, and hence a subsequent step of removing the polysilicon is not required, the SOI wafer manufacturing process can be simplified, and a cost for manufacturing the SOI wafer can be decreased without requiring new facilities.

Furthermore, even if an oxide film on a back surface intended to reduce the warpage of the SOI wafer is formed, since mixing the HCl gas in the reactive gas at the step of forming the epitaxial layer like the present invention does not cause growth of the polysilicon, a step of completely removing the oxide film on the terrace portion of the SOI wafer before the step of forming the epitaxial layer is not required as different from the conventional technology, and the oxide film on the back surface is not reduced beyond necessity. Therefore, since a thickness of the oxide film on the back surface of the SOI wafer to be manufactured can be maintained, the SOI wafer that the warpage is suppressed even after the epitaxial growth can be manufactured.

In this case, it is preferable to set a flow rate of the HCl gas to 1% or above of a flow rate of the reactive gas.

When the flow rate of the HCl is set to 1% or above with respect to the flow rate of the reactive gas, the growth of the polysilicon can be efficiently suppressed.

Moreover, according to the preset invention, it is preferable to use an SOI wafer including an SOI layer having a film thickness reduced by an ion implantation delamination method as the SOI wafer that has the oxide film on the terrace portion and that the silicon epitaxial layer is formed.

As explained above, when the SOI wafer including the SOI layer whose film thickness is reduced by the ion implantation delamination method is used as the SOI wafer having the oxide film on the terrace portion before the silicon epitaxial layer is formed, the SOI wafer before forming the silicon epitaxial layer includes the SOI layer having the very excellent film thickness uniformity. Therefore, when the silicon epitaxial layer is formed on the thin SOI layer whose film thickness is reduced by the ion implantation delamination method, the high-quality SOI wafer in which a film thickness of the SOI layer is several µm and a thickness tolerance is approximately ±0.1 µm can be relatively easily manufactured as compared with an SOI wafer whose film thickness is reduced by grinding/polishing.

Additionally, according to the present invention, it is preferable to flow the HCl gas for a predetermined time before a raw material gas as the reactive gas is flowed into a reactor at the step of forming the silicon epitaxial layer.

As explained above, at the step of forming the silicon epitaxial layer, when the HCl gas is previously flowed for the predetermined time before the raw material gas as the reactive gas (the raw material gas+a carrier gas) is flowed into the reactor, i.e., in a state where the carrier gas alone flows in the reactor, a metal impurity that has adhered to the inside of the reactor or the upper side of the wafer can be removed, thereby depositing the silicon epitaxial layer having the higher quality.

In particular, when the HCl gas is previously flowed for the predetermined time with respect to the SOI wafer that includes the SOI layer whose film thickness is reduced by the ion implantation delamination method and has the oxide film on the terrace portion before the raw material gas as the reactive gas is flowed into the reactor at the step of forming the silicon epitaxial layer, silicon flakes that have adhered to the upper side of the oxide film on the terrace portion at the time of the ion implantation and delamination can be removed. Therefore, after the silicon epitaxial layer is formed, an Si island can be suppressed from being formed on the terrace portion.

Additionally, it is preferable to carry out a cleaning step of removing silicon flakes present on the terrace portion of the SOI wafer having the oxide film on the terrace portion before the step of forming the silicon epitaxial layer.

As explained above, when the cleaning step of removing the silicon flakes that are present on the terrace portion of the SOI wafer having the oxide film on the terrace portion is carried out before the step of forming the silicon epitaxial layer, the silicon flakes that have adhered to the upper side of the oxide film on the terrace portion at the time of ion implantation and delamination can be removed, and hence Si islands can be suppressed from being formed on the terrace portion after the silicon epitaxial layer is formed.

Further, it is preferable that an aqueous solution containing HF is used as a cleaning liquid for removing the silicon flakes to carry out cleaning in such a manner that a back-surface oxide film of the SOI wafer remains at the cleaning step.

As explained above, when the aqueous solution containing HF as a cleaning liquid that removes the silicon flakes is used to perform cleaning at the cleaning step in such a manner that the oxide film on the back surface included in the SOI wafer can remain, immersing the SOI wafer having the back-surface oxide film for avoiding warpage formed thereon in the HF aqueous solution causes the oxide film on the terrace portion to be slightly etched, and the silicon flakes that have adhered to the upper side of the oxide film on the terrace portion can be sufficiently removed, and the back-surface oxide film for avoiding warpage can stay to some extent. Therefore, the polysilicon does not grow on the oxide film on the terrace portion, and the Si islands formed of the silicon flakes can be suppressed, thereby easily obtaining the SOI wafer having reduced warpage of the SOI wafer.

Furthermore, it is preferable to adjust a reducing amount of a thickness of the oxide film on the terrace portion to 40 nm or above at the cleaning step.

When a thickness of the oxide film on the terrace portion that is to be reduced is adjusted to 40 nm or above at the cleaning step, the silicon flakes can be assuredly removed.

The method for manufacturing the SOI wafer according to the present invention can easily grow the silicon epitaxial layer on the SOI layer of the SOI wafer having the oxide film on the terrace portion, reduce generation of particles even in subsequent processes after, e.g., device manufacture, suppress the warpage of the SOI wafer to be manufactured, and decrease a cost for manufacturing such an SOI wafer.

BEST MODE(S) FOR CARRYING OUT THE INVENTION

As explained above, when manufacturing an SOI wafer that a film thickness of an SOI layer thereof is several μm and a thickness tolerance of approximately ±0.1 μm is required, a film thickness of a bond wafer can be reduced based on the ion implantation delamination method in a bonding method, and epitaxial growth can be carried out on the SOI layer. However, when an oxide film is formed on a base wafer to avoid warpage of the SOI wafer to fabricate the SOI wafer, the oxide film is exposed on a peripheral terrace portion (an unbonded portion) of the SOI wafer. When epitaxial layer growth is performed on the SOI layer in this state, polysilicon grows on the oxide film on the terrace portion, which becomes a factor of generation of particles in subsequent processes.

On the other hand, to prevent this polysilicon from growing, it is general to immerse the SOI wafer in an HF aqueous solution to completely remove the oxide film on the terrace portion and then carry out epitaxial growth. However, when the SOI wafer having an anti-warpage back-surface oxide film formed thereon is immersed in the HF aqueous solution, since a thickness of the back-surface oxide film is reduced by an amount equal to a reducing amount of a thickness of the oxide film on the terrace portion, completely removing the oxide film on the terrace portion causes the anti-warpage back-surface oxide film to hardly remain, and the warpage of the SOI wafer is increased.

Further, when the oxide film on the terrace portion is completely removed, there occurs a problem that a BOX layer below a periphery of the SOI layer is greatly corroded, an unstable state of an overhang structure is provided, which results in a particle generation source.

To solve such a problem, the present inventors have keenly repeated studies.

As a result, in order to readily grow a silicon epitaxial layer on the SOI layer of the SOI wafer having the oxide film on the terrace portion, suppress the warpage of the SOI wafer to be manufactured, reduce generation of particles even in subsequent processes such as device manufacture, and decrease a cost for manufacturing such an SOI wafer, they have conceived that the silicon epitaxial layer can be formed on the SOI layer alone by mixing an HCl gas in a reactive gas without forming an unnecessary deposit, e.g., polysilicon on the oxide film on the terrace portion when performing silicon epitaxial growth on the SOI layer of the SOI wafer having the oxide film on the terrace portion, thereby bringing the present invention to completion.

Embodiments according to the present invention will now be explained hereinafter with reference to the drawings, but the present invention is not restricted thereto.

Figure 1:
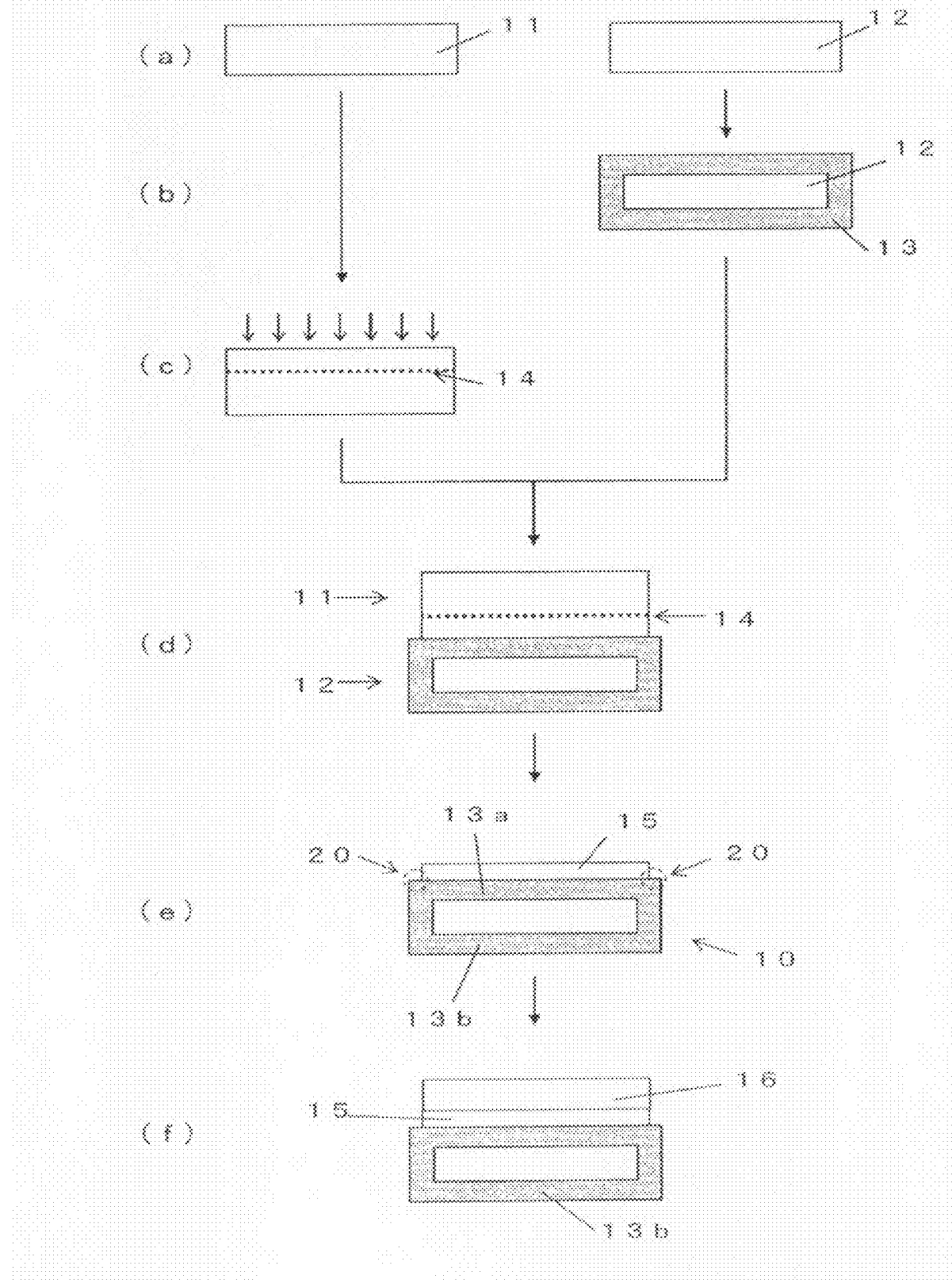
FIG. 1 is a schematic view for explaining a first embodiment of a method for manufacturing an SOI wafer according to the present invention.

As a first embodiment of the present invention, a description will be given as to a method for manufacturing an SOI wafer that fabricates an SOI wafer having an oxide film on a terrace portion and an SOI layer thinned by the ion implantation delamination method and forms a silicon epitaxial layer on the SOI layer of the SOI wafer. FIG. 1 is a schematic view for explaining the first embodiment of the method for manufacturing an SOI wafer according to the present invention.

A bond wafer 11 and a base wafer 12 are first prepared (a step a).

Although each of the bond wafer and the base wafer are not restricted in particular, a wafer formed of, e.g., a silicon single crystal can be used. Further, for the purpose of, e.g., improving a gettering capability, a silicon single crystal wafer containing a dopant at a high concentration may be used, and its conductivity type may be either n-type or p-type.

Then, a thermal oxidation treatment is carried out with respect to the base wafer 12 to form an oxide film 13 on an entire surface of the base wafer (a step b).

In recent year, when manufacturing an SOI wafer having a thick buried oxide film layer in particular, forming the oxide film on a bonding surface side alone causes the wafer to warp in a convex shape on a surface where the oxide film is formed, and hence the oxide film 13 is often formed on the entire surface of the base wafer to reduce the warpage of the wafer. Furthermore, a oxide film 13b formed on a back surface on an opposite side of the bonding surface of the base wafer is not removed even in a subsequent process, this product is shipped as an SOI wafer product, and it is often the case that the back-surface oxide film 13b is not removed even in a device manufacturing process.

It is to be noted that a thickness of the oxide film formed at the step b is not restricted in particular in the present invention. Further, the thermal oxidation method for the base wafer 12 is not restricted in particular, and there is, e.g., wet oxidation. One of the oxide films 13 formed at this step becomes a buried oxide film 13a and the other becomes the back-surface oxide film 13b after bonding.

On the other hand, at least either hydrogen ions or rare gas ions are implanted into the bond wafer 11 to form an ion implanted layer 14 (a step c).

A depth of the ion implanted layer 14 at this time is reflected in a thickness of an SOI layer 15 that is formed after delamination. Therefore, when implantation energy and others are controlled to perform the ion implantation, the thickness of the SOI layer 15 can be controlled.

Before forming this ion implanted layer 14, a silicon oxide film layer (not shown) may be formed on an entire surface of the bond wafer 11 based on thermal oxidation in order to avoid channeling.

Then, the bond wafer 11 is bonded to the base wafer 12 through the oxide film 13 on the base wafer 12 (a step d).

At this time, a bonding surface of the bond wafer 11 is determined as a surface where the ion implantation is carried out at the step c.

At this bonding step, for example, when one main surface of the bond wafer 11 is brought into contact with one main surface of the base wafer 12 in a clean atmosphere at an ordinary temperature, the wafers are bonded to each other without using, e.g., an adhesive.

Then, the bond wafer 11 is delaminated at the ion implanted layer 14 to reduce a film thickness of the bond wafer 11, thereby forming the SOI layer 15 (a step e).

For example, when a heat treatment is applied to the bonded wafers in an inert gas atmosphere such as Ar at a temperature of approximately 500° C. or above for 30 minutes or more, the bond wafer 11 can be delaminated at the ion implanted layer 14 based on reorientation of crystals and agglomeration of air bubbles.

Here, a bonding heat treatment for improving a bonding force for the SOI layer 15 and the base wafer 12 may be performed. For example, this bonding heat treatment can be carried out in an inert gas atmosphere or a slightly oxidizing atmosphere at 1000° C. to 1250° C. for 30 minutes to 4 hours.

It is to be noted that a surface of the SOI layer immediately after the delamination has poor surface roughness or ion implantation damages remaining thereon as compared with a mirror-polished surface of a regular mirror-polished wafer, and hence directly performing epitaxial growth on the surface of this layer may result in occurrence of crystal defects in the epitaxial layer.

Therefore, the epitaxial growth can be carried out after flattening the surface of the SOI layer by effecting a treatment of slightly polishing the surface (which may be called touch polishing), a high-temperature heat treatment using, e.g., an inert gas or a hydrogen atmosphere, a treatment of forming a thermal oxide film in an oxidizing atmosphere and then removing this thermal oxide film (a sacrificial oxidation treatment), or a flattening treatment as an appropriate combination of these treatments with respect to the surface of the SOI layer immediately after the delamination.

With the above-described steps, an SOI wafer 10 having the oxide film 13 exposed on a terrace portion 20 is fabricated. When a film thickness of the bond wafer 11 is reduced by the ion implantation delamination method in this manner, the SOI wafer 10 having every excellent film thickness uniformity of the SOI layer 15 is obtained.

Further, a silicon epitaxial layer 16 is formed on an entire surface of the SOI layer 15 of the SOI wafer 10 having the oxide film on the terrace portion (a step f). In the present invention, an HCl gas is mixed in a reactive gas at this step.

First, before supplying a raw material gas into a reactor (not shown), a temperature is increased to a reaction temperature in an atmosphere containing a carrier gas alone, and then the raw material gas is flowed.

As the reactive gas that is used to form the silicon epitaxial layer 16 on the entire surface of the SOI layer, trichlorosilane ($SiHCl_3$) as the raw material gas and a hydrogen gas ($H_2$) as the carrier gas are supplied at a flow rate of 1:5, and a substance obtained by mixing an HCl gas in this reactive gas is supplied in particular in the present invention.

When the HCl gas is mixed in the reactive gas when forming the silicon epitaxial layer on the entire surface of the SOI layer of the SOI wafer having the oxide film on the terrace portion, polysilicon is etched by the HCl gas even though the polysilicon is formed on the oxide film on the terrace portion 20, and hence the silicon epitaxial layer 16 can be selectively grown on the SOI layer 15 alone. Therefore, since the polysilicon is not formed on the terrace portion 20 of the SOI wafer 10, generation of particles due to the polysilicon can be reduced at subsequent steps.

When the reactive gas alone is used without mixing the HCl gas that has an etching effect with respect to the polysilicon, since the polysilicon is formed on the terrace portion, a step of removing the polysilicon formed on the terrace portion alone is required after the silicon epitaxial layer forming step.

However, in the present invention, since the HCl gas is mixed in the reactive gas when forming the silicon epitaxial layer, the polysilicon is not grown on the terrace portion, and the step of removing the polysilicon is not required. Therefore, the steps that are used to manufacture the SOI wafer having the epitaxial layer formed on the SOI layer are simplified, and a cost for manufacturing the SOI wafer can be decreased without requiring new facilities for removing the polysilicon.

Furthermore, even when the back-surface oxide film 13b that is intended to reduce warpage is formed on the SOI wafer 10 as shown in FIG. 1, the growth of the polysilicon can be suppressed in the present invention by mixing the HCl gas in the reactive gas at the time of forming the epitaxial layer, and hence a film thickness of the anti-warpage back-surface oxide film is not reduced beyond necessity without requiring a step of completely removing the oxide film on the terrace portion before the epitaxial layer forming step as different from the conventional example. Therefore, a thickness of the back-surface oxide film on the SOI wafer to be manufactured can be maintained, thereby manufacturing the SOI wafer that warpage is suppressed.

Moreover, it is preferable to set a flow rate of the HCl gas to be mixed to 1% or above with respect to a flow rate of the reactive gas when forming the silicon epitaxial layer in the present invention.

When the flow rate of the HCl gas to be mixed is set to 1% or above with respect to the flow rate of the reactive gas, an effect of etching the polysilicon on the terrace portion can be assuredly obtained, and hence the silicon epitaxial layer can be grown on the SOI layer alone while efficiently suppressing the growth of the polysilicon.

It is to be noted that an upper limit of the flow rate of the HCl gas is not restricted in particular as long as the effect of suppressing the growth of the polysilicon on the terrace portion can be obtained, but a film thickness distribution of the epitaxial layer may exceed ±10% when the flow rate of the HCl gas exceeds 5%.

Therefore, it is preferable to set the flow rate of the HCl gas to 5% or below.

Figure 5:
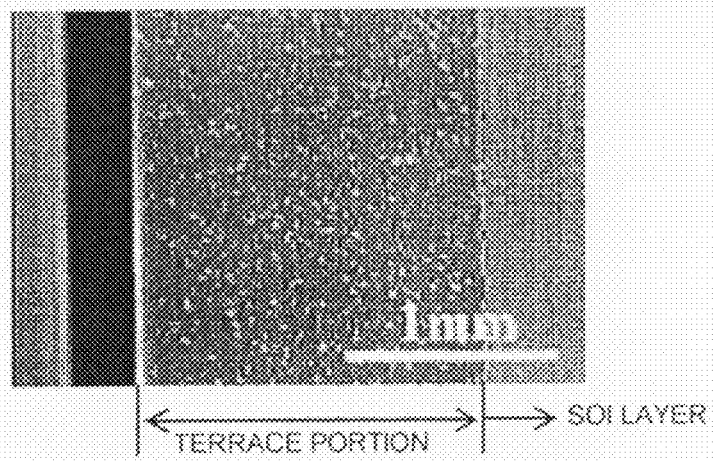
FIG. 5 is views showing a result of using an optical microscope to observe a part of a terrace portion of an SOI wafer having an SOI layer formed thereon by an ion implantation delamination method before forming an epitaxial layer, where (A) is a view showing a part near a boundary between the SOI layer and the terrace portion and (B) is an enlarged view of the terrace portion in (A)
Figure 5:
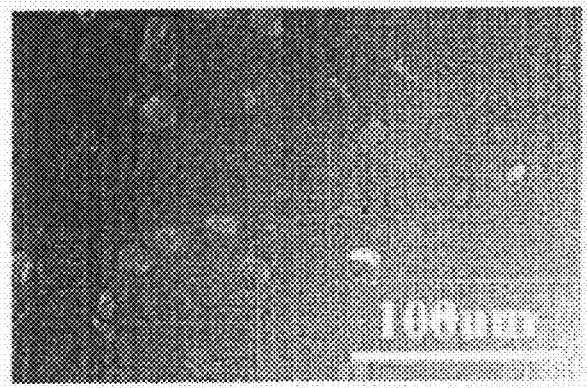

On the other hand, according to further studies conducted by the present inventors, it has been revealed that there is a factor of generation of particles at device manufacturing steps after the epitaxial layer forming step besides the polysilicon that grows on the oxide film on the terrace portion. That is a silicon flake that adheres at the time of delamination of the bond wafer when the SOI wafer having the oxide film on the terrace portion is fabricated based on the ion implantation delamination method in particular. This silicon flake adheres to the upper side of the oxide film on the terrace portion as shown in FIG. 5. FIG. 5 is views showing a result of using an optical microscope to observe a part of the terrace portion of the SOI wafer having the SOI layer formed thereon by the ion implantation delamination method before forming the epitaxial layer, where FIG. 5(A) is a view of a part near a boundary between the SOI layer and the terrace portion and FIG. 5(B) is an enlarged view of the terrace portion in FIG. 5(A).

It has been revealed that, when the epitaxial growth is carried out with such silicon flakes as shown in FIG. 5(B) remaining on the terrace portion, the epitaxial layer is formed on the silicon flakes to be turned to Si islands in addition to the problem that the polysilicon is grown on the oxide film on the terrace portion, and this Si island becomes a factor of particle contamination and others at subsequent steps like the polysilicon.

Thus, the present inventors have repeatedly actively conducted further studies and thereby conceived an idea of removing the silicon flakes before forming the silicon epitaxial layer on the SOI layer in order to suppress the growth of the polysilicon at the time of forming the silicon epitaxial layer and avoid generation of the Si islands.

Figure 2:
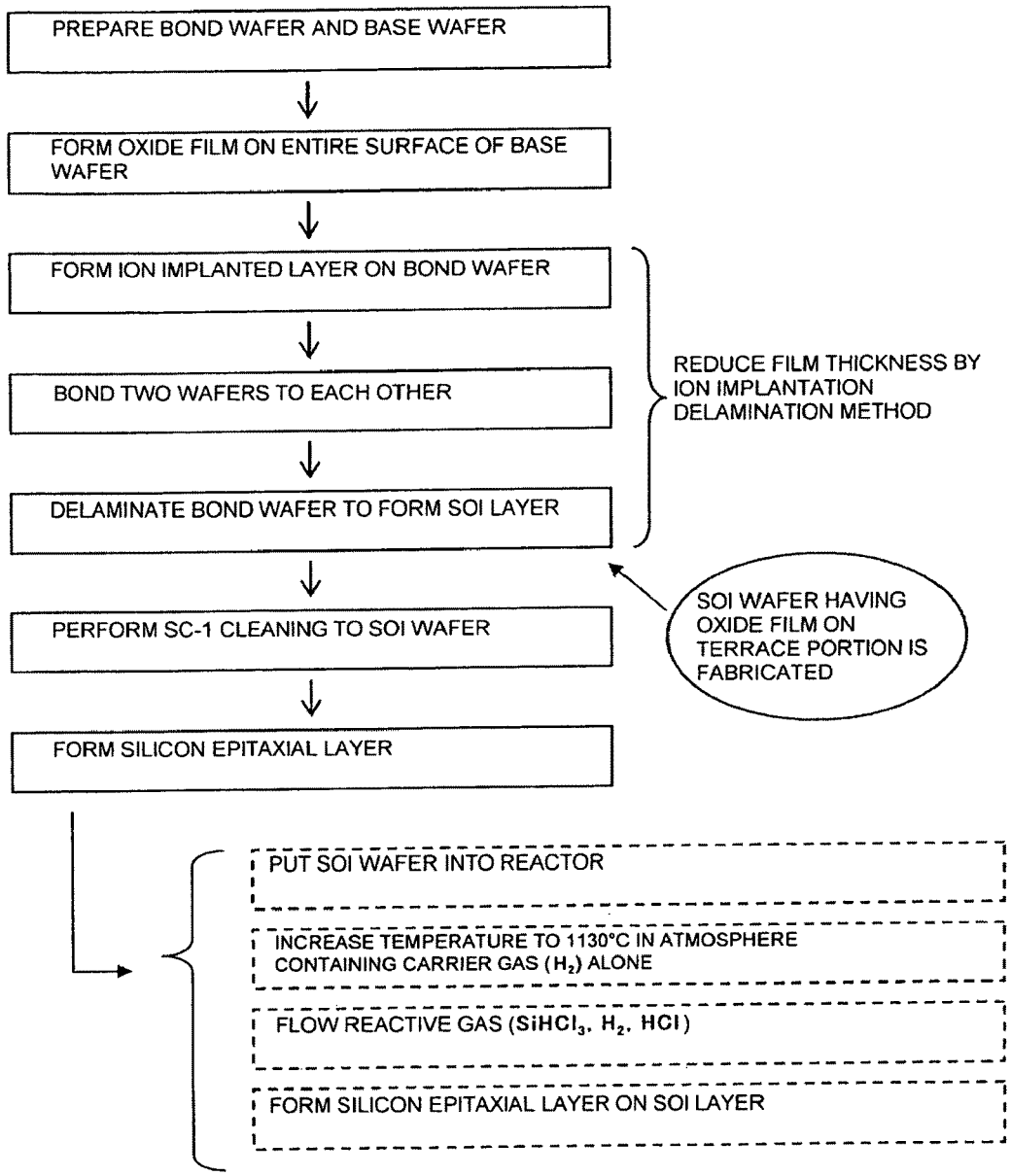
FIG. 2 is a flowchart of a second embodiment of a method for manufacturing an SOI wafer according to the present invention.

To remove such silicon flakes, it is preferable to carry out a cleaning step of removing the silicon flakes that are preset on the terrace portion of the SOI wafer having the oxide film on the terrace portion before the step f of forming the silicon epitaxial layer 16 on the entire surface of the SOI layer 15 of the SOI wafer 10 having the oxide film on the terrace portion according to the first embodiment. Specifically, the cleaning step can be carried out in such a flow as depicted in FIG. 2. FIG. 2 is a flowchart of a second embodiment of a method for manufacturing an SOI wafer according to the present invention.

In this second embodiment, an SOI wafer having an oxide film on a terrace portion is fabricated in the same procedure as the steps a to e according to the first embodiment based on the ion implantation delamination method.

Further, to remove silicon flakes that have adhered to an upper side of an oxide film on a terrace portion before forming an epitaxial layer with respect to this SOI wafer, SC-1 cleaning (cleaning using a mixed aqueous solution containing $NH_4OH$ and $H_2O_2$) is carried out. According to the SC-1 cleaning, the oxide film on the terrace portion and the back surface of the SOI wafer is hardly etched.

When the cleaning step of removing the silicon flakes that are present on the terrace portion of the SOI wafer having the oxide film on the terrace portion is carried out in this manner, the silicon flakes that have adhered to the upper side of the oxide film on the terrace portion at the time of ion implantation delamination can be removed, and hence Si islands can be suppressed from being produced on the terrace portion after forming a silicon epitaxial layer.

It is to be noted that this cleaning step is not restricted to the SC-1 cleaning, and cleaning that has an effect of removing attached particles and can remove the silicon flakes can suffice. For example, it may be cleaning based on a cleaning liquid using organic alkali such as cholin or tetramethylammonium hydroxide.

In particular, it is preferable to use an aqueous solution containing HF as a cleaning liquid that removes the silicon flakes and perform cleaning so that a back-surface oxide film included in the SOI wafer can remain at the cleaning step.

As a result, the silicon flakes that have adhered to the upper side of the oxide film on the terrace portion can be removed, the silicon flakes can be more assuredly removed as compared with the SC-1 cleaning, and the back-surface oxide film can remain, thereby avoiding occurrence of the warpage of the SOI wafer.

However, as explained above, when the SOI wafer is cleaned with the aqueous solution containing HF, an entire surface of the formed silicon oxide film is homogeneously etched. Therefore, the anti-warpage back-surface film is caused to remain to some extent by slightly performing cleaning in such a manner that the back-surface oxide film included in the SOI wafer can remain. Then, polysilicon does not grow on the oxide film on the terrace portion, the Si islands formed of the silicon flakes are suppressed, and the SOI wafer that the SOI wafer warpage is reduced can be easily obtained.

In this case, when forming the oxide film on a base wafer before bonding, the oxide film may be thickly formed in advance. Moreover, when the cleaning step of removing the silicon flakes that are present on the terrace portion is carried out by using HF spin cleaning, the anti-warpage back-surface oxide film is not etched, and hence this cleaning step is effective when required specifications for warpage are severe.

Additionally, it is preferable to adjust the oxide film on the terrace portion to be etched in such a manner that a reducing amount of a thickness thereof becomes 40 nm or above at the cleaning step.

When the thickness of the oxide film on the terrace portion to be removed is set to 40 nm or above in this manner, the silicon flakes can be greatly removed as compared with a case where the SC-1 cleaning alone is performed, and removing the oxide film on the terrace portion for 70 nm or more from the surface in particular enables substantially assuredly removing the silicon flakes from the oxide film on the terrace portion by cleaning.

However, when the SOI wafer is immersed in the aqueous solution containing HF to be cleaned, the back-surface oxide film is also removed for the same thickness as that of the oxide film on the terrace portion. Since a considerable reduction in thickness of the back-surface oxide film affects the warpage of the SOI wafer, it is preferable to adjust the thickness of the oxide film to be removed to become approximately 10% or below of the thickness of the back-surface oxide film before removal.

Further, when cleaning having a particle removing effect, e.g., the SC-1 cleaning is combined with the cleaning using the aqueous solution containing HF to perform cleaning, the silicon flakes can be further effectively removed.

Figure 3:
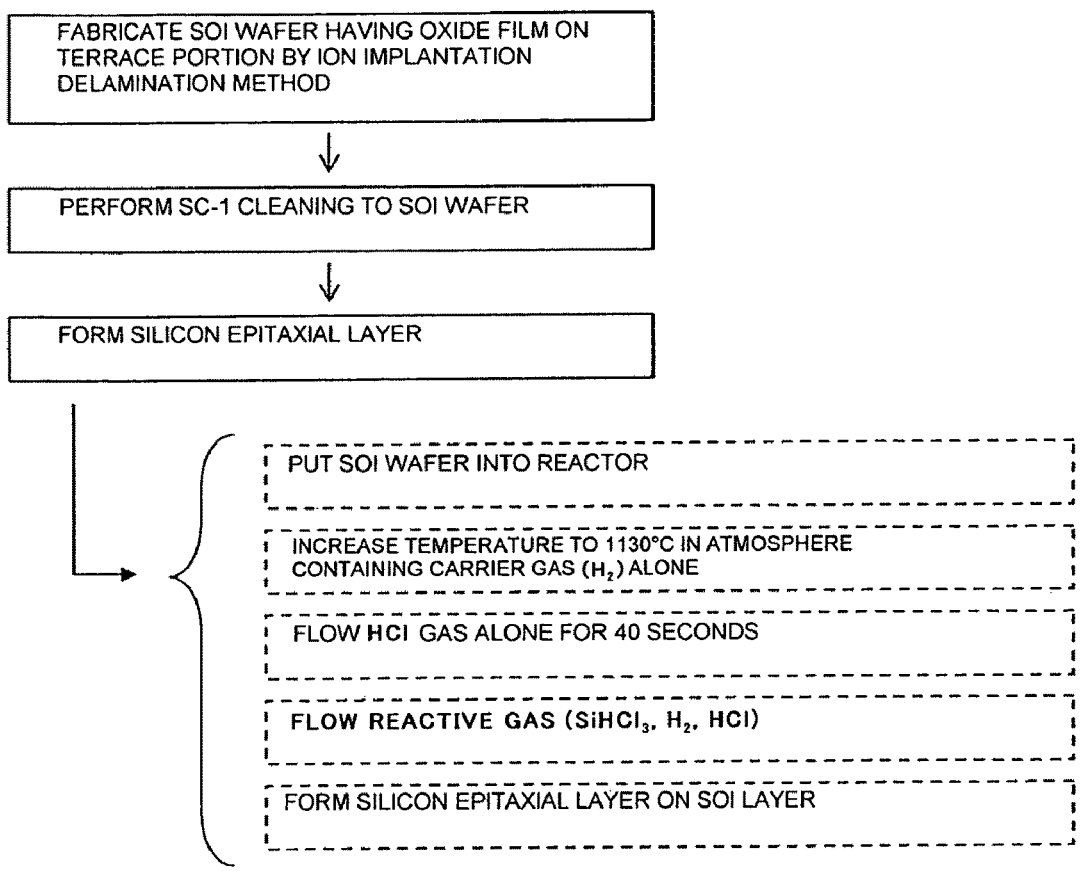
FIG. 3 is a flowchart of a third embodiment of a method for manufacturing an SOI wafer according to the present invention.

On the other hand, as a further method of removing the silicon flakes, as shown in FIG. 3, it is preferable to flow an HCl gas for a predetermined time before flowing a raw material gas as a reactive gas into a reactor at a step of forming a silicon epitaxial layer. This conformation will now be explained hereinafter as a third embodiment according to the present invention. FIG. 3 is a view showing a flow of the third embodiment of a method for manufacturing an SOI wafer according to the present invention.

First, an SOI wafer having an oxide film on a terrace portion is fabricated based on the ion implantation delamination method in accordance with a procedure including the steps a to e explained in FIG. 1 of the first embodiment.

Then, to remove silicon flakes produced by the ion implantation delamination method in advance, SC-1 cleaning is carried out with respect to the fabricated SOI wafer.

Subsequently, a step of forming a silicon epitaxial layer on an entire surface of an SOI layer is carried out with respect to the SOI wafer having an oxide film on a terrace portion from which silicon flakes have been removed.

At this silicon epitaxial layer forming step, the SOI wafer is first put into a reactor, and a temperature is increased to a reaction temperature in an atmosphere containing a carrier gas (e.g., $H_2$) alone.

Then, an HCl gas is flowed into the reactor in addition to the carrier gas for, e.g., 40 seconds.

As a result, a heavy metal that has adhered to the inside of the reactor or a natural oxide film formed on an surface of the SOI layer on which the silicon epitaxial layer is to be formed can be removed, and hence the high-quality silicon epitaxial layer having a uniform film thickness can be deposited.

Further, before growing the silicon epitaxial layer, combining the SC-1 cleaning with supply of the HCl gas alone to the carrier gas enables removing the silicon flakes that have adhered to the upper side of the oxide film on the terrace portion from the upper side of the oxide film on the terrace portion. Therefore, Si islands can be suppressed from being formed on the oxide film on the terrace portion at the time of subsequent growth of the silicon epitaxial layer.

Then, when a reactive gas having the HCl gas mixed therein (e.g., trichlorosilane+hydrogen+HCl) is flowed at a fixed flow rate to react a raw material gas (trichlorosilane), the silicon epitaxial layer can be grown on the SOI layer alone, thereby obtaining the SOI wafer having an increased film thickness of the SOI layer.

According to the third embodiment, when the silicon flakes are removed by, e.g., the SC-1 cleaning, then the silicon flakes are further removed by the HCl gas in advance at the epitaxial layer forming step, and the HCl gas is mixed with the reactive gas, the polysilicon and the Si islands can be suppressed from being formed even if the oxide film remains on the terrace portion of the SOI wafer. Therefore, a cleaning step that requires new facilities, e.g., HF spin etching for removing the polysilicon or the Si islands while leaving the back-surface oxide film is not necessary at subsequent steps. Therefore, the thus manufactured SOI wafer is an SOI wafer in which less warpage is observed, a film thickness of the SOI layer is very uniformly increased, and generation of particles is suppressed even though the oxide film is present on the terrace portion.

The above first to third embodiments are examples of the present invention having the SOI layer thinned by the ion implantation delamination method. A fourth embodiment according to the present invention having an SOI layer thinned by grinding/polishing will now be explained with reference to FIG. 4.

Figure 4:
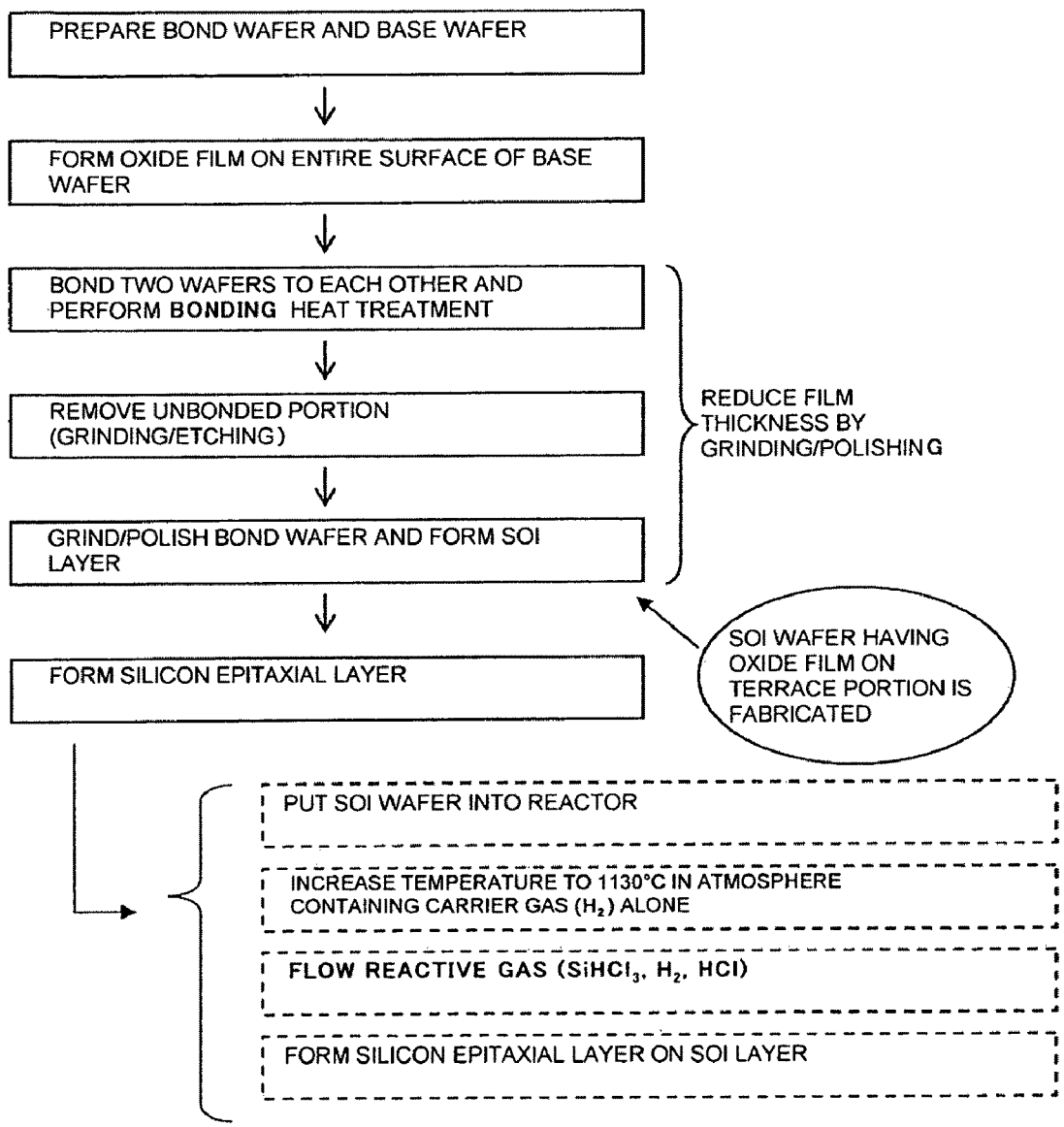
FIG. 4 is a flowchart of a fourth embodiment of a method for manufacturing an SOI wafer according to the present invention.

FIG. 4 is a view showing a flow of the fourth embodiment of a method for manufacturing an SOI wafer according to the present invention. In FIG. 4, a bond wafer and a base wafer as raw material wafers are used to fabricate an SOI wafer based on the bonding method are first prepared. Although each of the bond wafer and the base wafer is not restricted in particular, a silicon single crystal wafer can be used, for example.

Then, a heat treatment is performed with respect to the base wafer of the prepared silicon single crystal wafers to form a silicon thermal oxide film on an entire surface of the base wafer.

Subsequently, the bond wafer and the base wafer having the oxide film formed thereon are attached firmly to each other in a clean atmosphere. A heat treatment is applied to these wafers in an oxidizing atmosphere to strongly bond the bond wafer to the base wafer. As heat treatment conditions, the heat treatment can be carried out in an atmosphere containing oxygen or water vapor at a temperature of 200° C. to 1200° C., for example. At this time, the bond wafer and the base wafer are strongly bonded to each other (a bonding heat treatment).

An unbonded portion of the bond wafer and the base wafer is present in the range of approximately 2 mm at an outer peripheral portion of the bonded wafer obtained by bonding in this manner. Such an unbonded portion must be removed since it cannot be used as an SOI layer on which a device is fabricated and it falls off at subsequent steps to cause various problems.

To remove the unbonded portion, the outer peripheral portion of the bond wafer where the unbonded portion is present is first ground to a predetermined thickness to remove the unbonded portion. Adopting grinding enables performing removal at a high speed and providing a high machining accuracy. In this case, the predetermined thickness may be, e.g., 20 to 150 μm.

Then, etching is carried out to obtain a wafer with the unbonded portion at the outer peripheral portion of the bond wafer being removed. This etching can be easily performed by immersing the bonded wafer in an etchant having a considerably higher silicon single crystal etching rate than that of an oxide film. As such etching, there is so-called alkali etching using, e.g., KOH or NaOH. Based on such etching, a terrace portion where the oxide film is exposed is formed.

Then, a surface of the bond wafer is thinned by grinding/polishing until a desired thickness is obtained, thereby forming an SOI layer. As a result, an SOI wafer that has the SOI layer thinned by grinding/polishing and has the oxide film on the terrace portion is obtained.

Moreover, a silicon epitaxial layer is formed on an entire surface of the SOI layer of the SOI wafer having the oxide film on the terrace portion.

First, before supplying a raw material gas into a reactor (not shown), a temperature is increased to a reaction temperature in an atmosphere containing a carrier gas alone and then the raw material gas is flowed.

As a reactive gas that is used to form the silicon epitaxial layer on the entire surface of the SOI layer, for example, trichlorosilane and a hydrogen gas are supplied at a flow rate of 1:5 and an HCl gas is mixed in this reactive gas like the first to third embodiments.

When forming the silicon epitaxial layer on the entire surface of the SOI layer of the SOI wafer having the oxide film on the terrace portion in this manner, the silicon epitaxial layer can be selectively grown on the SOI layer alone by mixing the HCl gas in the reactive gas. Therefore, since polysilicon is not formed on the terrace portion of the SOI wafer, generation of particles due to the polysilicon can be reduced at subsequent steps. According to this method, as different from the ion implantation delamination method, there can be obtained an advantage that silicon flakes are hardly produced on the terrace portion.

Although the present invention will now be specifically explained based on examples and comparative examples of the present invention, the present invention is not restricted thereto.

EXAMPLE 1

First, an SOI wafer 10 having an oxide film on a terrace portion was fabricated based on the ion implantation delamination method.

The SOI wafer 10 obtained by this method had a diameter of approximately 30 mm, and a film thickness of an SOI layer 15 thinned from a bond wafer was 150 nm. Further, a buried oxide film layer had a thickness of 3200 nm, and both an oxide film on a terrace portion and a back-surface oxide film had a film thickness of 2800 nm.

Figure 6:
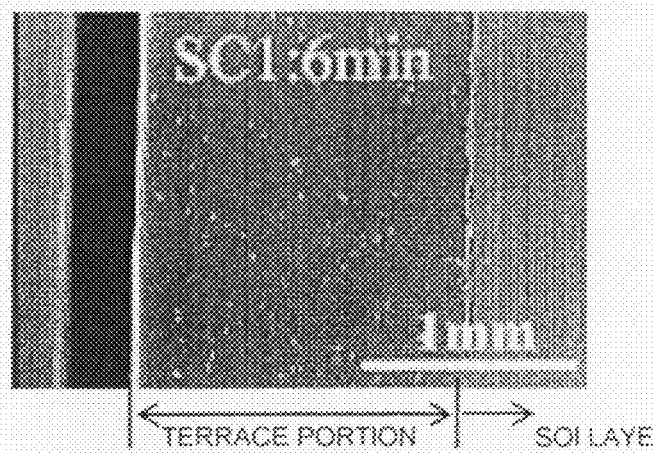
FIG. 6 is a view of a part near a boundary between a terrace portion and an SOI layer, where (A) is a view immediately after SC-1 cleaning is performed in an SOI wafer having the SOI layer thinned by the ion implantation and delamination and an oxide film on a terrace portion, (B) is a view showing a result in Example 3, and (C) is a view showing a result in Example 4.
Figure 6:
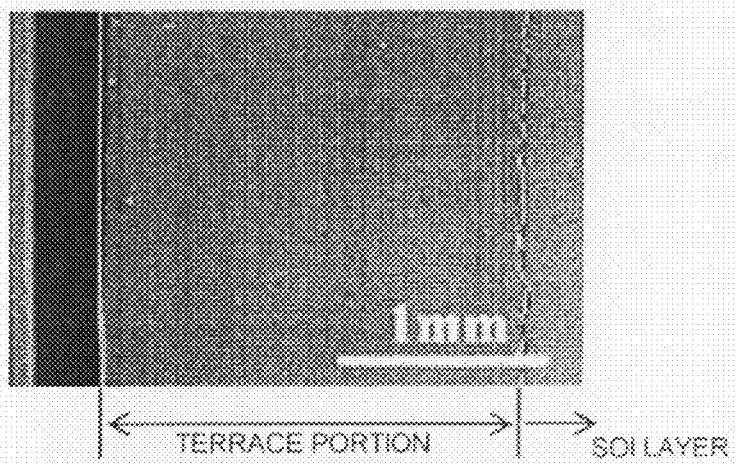
Figure 6:
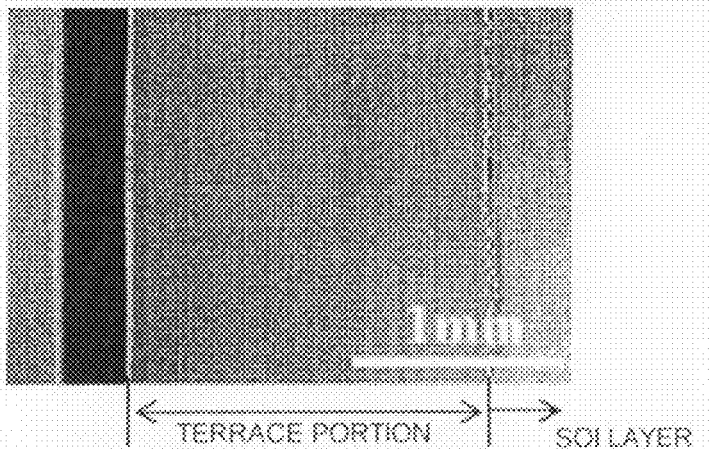

Then, before forming an epitaxial layer, SC-1 cleaning (cleaning using a mixed aqueous solution containing $NH_4OH$ and $H_2O_2$) was carried out at 75° C. for 6 minutes as cleaning for removing silicon flakes on the terrace portion. FIG. 6(A) shows a result of observing an attachment status of the silicon flakes on the terrace portion after the cleaning by using an optical microscope. FIG. 6 is partial views of a part near a boundary between the terrace portion and the SOI layer. In FIG. 6(A), the silicon flakes were observed to some extent.

Subsequently, the SOI wafer was put into a reactor, and a temperature in the reactor was increased to 1130° C. as a reaction temperature of a raw material gas in an atmosphere containing a carrier gas (hydrogen) alone. Then, a growth temperature of an epitaxial layer was set to 1130° C., and trichlorosilane, hydrogen, and an HCl gas were used as a reactive gas.

The supply reactive gas containing 10 SLM of the trichlorosilane ($SiHCl_3$), 50 SLM of the hydrogen ($H_2$), and 1.8 SLM of the hydrogen chloride (HCl) gas (a flow rate of the HCl gas with respect to a flow rate of the reactive gas is 3%) was supplied into the reactor to form 3 μm of a silicon epitaxial layer 16 on an entire surface of the SOI layer of the SOI wafer 10 having the oxide film on the terrace portion.

As a result of observing a surface of the SOI wafer having the silicon epitaxial layer formed on the thus manufactured SOI layer by sight and an optical microscope, a deposit of polysilicon was not present on the oxide film on the terrace portion. Furthermore, as a result of observing the whole circumference of the terrace portion, it was observed that some Si islands were formed in some regions on the oxide film.

EXAMPLE 2

An SOI wafer fabricated under the same conditions as those of Example 1 was used, and SC-1 cleaning (cleaning using a mixed aqueous solution containing $NH_4OH$ and $H_2O_2$) was first carried out at 75° C. for 6 minutes as cleaning for removing silicon flakes present on a terrace portion before forming an epitaxial layer based on such a flow as depicted in FIG. 3.

Then, a silicon epitaxial layer with a thickness of 3 μm was formed on an entire surface of an SOI layer.

At this time, a growth temperature of the epitaxial layer was set to 1130° C., and an HCl gas was flowed for 40 seconds prior to supply of a raw material gas (trichlorosilane) into a reactor after a temperature reached 1130° C. in an atmosphere containing carrier gas alone. Additionally, as a reactive gas, trichlorosilane, hydrogen, and the HCl gas were used.

As a flow rate of the reactive gas to be supplied, 10 SLM of the trichlorosilane ($SiHCl_3$), 50 SLM of the hydrogen ($H_2$), and 1.8 SLM of the hydrogen chloride (HCl) gas were used (a flow rate of the HCl gas with respect to the flow rate of the reactive gas is 3%).

As a result of observing a surface of the SOI wafer having the silicon epitaxial layer formed on the thus manufactured SOI layer by sight and an optical microscope, a deposit of polysilicon was not found on an oxide film on a terrace portion. Further, although the whole circumference of the terrace portion was observed in detail, formation of Si islands was not observed at all.

EXAMPLE 3

An SOI wafer fabricated under the same conditions as those of Example 1 was used, and a silicon epitaxial layer with a thickness of 3 μm was formed on an entire surface of an SOI layer of this wafer under the same conditions as those of Example 1.

However, as cleaning for removing silicon flakes present on a terrace portion before forming the epitaxial layer, a 12.5% HF aqueous solution was used, and a cleaning time was adjusted so as to remove an oxide film on the terrace portion for 40 nm. At the same time, a back-surface oxide film was also removed for 40 nm. (FIG. 6(B)) shows a result of observing an attachment status of the silicon flakes on the terrace portion after the cleaning by sight and an optical microscope.

As a result of observing a surface of the SOI wafer having the silicon epitaxial layer formed on the thus manufactured SOI layer by sight and an optical microscope, a deposit of polysilicon was not found on the oxide film on the terrace portion. Furthermore, as a result of observing a whole circumference of the terrace portion, it was observed that a very few Si islands were formed on the oxide film. It is to be noted that an Si island formation density was lower than that in Example 1.

EXAMPLE 4

An SOI wafer fabricated under the same conditions as those in Example 1 was used, and 3 μm of a silicon epitaxial layer having a thickness of 3 μm was formed on an entire surface of an SOI layer thereof under the same conditions as those in Example 1.

However, as cleaning for removing silicon flakes present on a terrace portion before forming the epitaxial layer, a 12.5% HF aqueous solution was used, and a cleaning time was adjusted so as to remove an oxide film on the terrace portion for 70 nm. At the same time, a back-surface oxide film was also removed for 70 nm. (FIG. 6(C)) shows a result of observing an attachment status of the silicon flakes on the terrace portion after the cleaning by sight and an optical microscope.

As a result of observing a surface of the SOI wafer having the silicon epitaxial layer formed on the thus manufactured SOI layer by sight and an optical microscope, a deposit of polysilicon was not found on the oxide film on the terrace portion. Furthermore, as a result of observing a whole circumference of the terrace portion in detail, formation of Si islands was not observed at all.

EXAMPLE 5

An SOI wafer having an oxide film on a terrace portion was fabricated by using a wafer bonding method that reduces a film thickness of a bond wafer by grinding/polishing to form an SOI layer.

The SOI wafer obtained by this method had a diameter of approximately 200 mm, and a film thickness of the SOI layer was 10 μm. Furthermore, a buried oxide film layer and the oxide film on the terrace portion had a film thickness of 1000 nm, and a back-surface oxide film had a film thickness of 1500 nm.

Then, a silicon epitaxial layer with a thickness of 3 μm was formed on an entire surface of the SOI layer of the SOI wafer having the oxide film on the terrace portion.

At this time, a growth temperature of the epitaxial layer was set to 1130° C., and trichlorosilane, hydrogen, and an HCl gas were used as a reactive gas.

10 SLM of the trichlorosilane ($SiHCl_3$), 50 SLM of the hydrogen ($H_2$), and 1.2 SLM of the hydrogen chloride (HCl) gas were used as a flow rate of a reactive gas to be supplied (a flow rate of the HCl gas with respect to the flow rate of the reactive gas is 2%), and the reactive gas and the HCl gas were simultaneously supplied into a reactor.

As a result of observing a surface of the SOI wafer having the silicon epitaxial layer formed on the thus manufactured SOI layer by sight and an optical microscope, a deposit of polysilicon and Si islands were not found on the oxide film on the terrace portion at all.

COMPARATIVE EXAMPLE 1

For comparison, an SOI wafer having an epitaxial layer formed on an SOI layer was manufactured under the same conditions by the same method as those in Example 1 except that the HCl gas was not mixed in the reactive gas.

As a result of observing a surface of the SOI wafer having the silicon epitaxial layer formed on the thus manufactured SOI layer by sight and an optical microscope like Examples, a deposit of polysilicon and Si islands were found on an oxide film on a terrace portion over substantially the whole circumference thereof.

COMPARATIVE EXAMPLE 2

For comparison, an SOI wafer having an epitaxial layer formed on an SOI layer was manufactured under the same conditions by the same method as those in Example 5 except that the HCl gas was not mixed in the reactive gas.

As a result of observing a surface of the SOI wafer having the silicon epitaxial layer formed on the thus manufactured SOI layer by sight and optical microscope like Examples, a deposit of polysilicon was found on an oxide film on a terrace portion over substantially the whole circumference thereof.

Results and manufacturing methods of Examples and Comparative Examples are written up in the following Table 1.

TABLE 1

| | | Example 1 | Example 2 | Example 3 | Example 4 | Comparative Example 1 | Example 5 | Comparative Example 2 |
|---|---|---|---|---|---|---|---|---|
| SOI wafer having oxide film on terrace portion | Diameter | 300 mm | | | | | 200 mm | |
| | Film thickness reducing method | Ion implantation delamination | | | | | Grinding/polishing | |
| | Film thickness of SOI layer | 150 nm | | | | | 10 μm | |
| | Film thickness of BOX layer | 3200 nm | | | | | 1000 nm | |
| | Thickness of oxide film on terrace portion | 2800 nm | | | | | 1000 nm | |
| | Film thickness of back-surface oxide film | 2800 nm | | | | | 1500 nm | |
| | Cleaning for removing silicon flakes | SC-1 cleaning | | HF aqueous solution (removal of 40 nm) | HF aqueous solution (removal of 70 nm) | NA | NA | NA |
| Formation of epitaxial layer | Supply of HCl gas | NA | 40 seconds | NA | NA | NA | NA | NA |
| | Supply of reactive gas | SiHCl$_3$ + H$_2$ + HCl | SiHCl$_3$ + H$_2$ + HCl | SiHCl$_3$ + H$_2$ + HCl | SiHCl$_3$ + H$_2$ + HCl | SiHCl$_3$ + H$_2$ | SiHCl$_3$ + H$_2$ + HCl | SiHCl$_3$ + H$_2$ |
| Results | Polysilicon on terrace portion | Absent | Absent | Absent | Absent | Present | Absent | Present |
| | Si islands on terrace portion | Some | Absent | Very few | Absent | Present | Absent | Present |
| | Film thickness of back-surface oxide film | 2800 nm | 2800 nm | 2760 nm | 2730 nm | 2800 nm | 1500 nm | 1500 nm |

Based on the results in Table 1, according to the method for manufacturing an SOI wafer of the present invention, even in the SOI wafer having the oxide film on the terrace portion, the silicon epitaxial layer can be easily grown on the SOI layer alone without growing an unnecessary deposit, e.g., the polysilicon or the Si islands on the terrace portion, and generation of particles caused due to the deposit can be reduced at subsequent steps. Furthermore, since the oxide film on the terrace portion does not have to be removed, when the SOI wafer has the thick back-surface oxide film, the warpage of the SOI wafer can be suppressed without reducing the film thickness beyond necessity. Moreover, since a polysilicon removing step is not newly required, a cost for manufacturing the SOI wafer can be decreased.

It is to be noted that the present invention is not restricted to the foregoing embodiments. Each of the foregoing embodiments is just an exemplification, and any examples that have substantially the same configuration and demonstrate the same functions and effects as the technical concept described in claims of the present invention are included in the technical scope of the present invention.

It is to be noted that the case where the epitaxial layer is formed on the SOI wafer fabricated based on the ion implantation delamination method has been explained in the present invention, but the present invention can obtain the same effects even in SOI wafers fabricated by any methods as long as the epitaxial layer is formed on the SOI wafer having the oxide film on the terrace portion.

The invention claimed is:

1. A method for manufacturing an SOI wafer having at least a step of forming a silicon epitaxial layer on an entire surface of an SOI layer of an SOI wafer having an oxide film on a terrace portion,
wherein
an SOI wafer including an SOI layer having a film thickness reduced by an ion implantation delamination method is used as the SOI wafer that has the oxide film on the terrace portion and that the silicon epitaxial layer is formed;
a cleaning step of removing silicon flakes present on the terrace portion of the SOI wafer having the oxide film on the terrace portion is carried out before the step of forming the silicon epitaxial layer: and
an HCl gas is mixed in a reactive gas when forming the silicon epitaxial layer.

2. The method for manufacturing an SOI wafer according to claim 1, wherein a flow rate of the HCl gas is set to 1% or above of a flow rate of the reactive gas.

3. The method for manufacturing an SOI wafer according to claim 1, wherein the HCl gas is flowed for a predetermined time before a raw material gas as the reactive gas is flowed into a reactor at the step of forming the silicon epitaxial layer.

4. The method for manufacturing an SOI wafer according to claim 2, wherein the HCl gas is flowed for a predetermined time before a raw material gas as the reactive gas is flowed into a reactor at the step of forming the silicon epitaxial layer.

5. The method for manufacturing an SOI wafer according to claim 1, wherein an aqueous solution containing HF is used as a cleaning liquid for removing the silicon flakes to carry out cleaning in such a manner that a back-surface oxide film of the SOI wafer remains at the cleaning step.

6. The method for manufacturing an SOI wafer according to claim 5, wherein a reducing amount of a thickness of the oxide film on the terrace portion is adjusted to 40 nm or above at the cleaning step.

* * * * *